United States Patent [19]

Kasai et al.

[11] Patent Number: 5,086,328
[45] Date of Patent: Feb. 4, 1992

[54] PHOTO-ANODIC OXIDE SURFACE PASSIVATION FOR SEMICONDUCTORS

[75] Inventors: Ichiro Kasai, Santa Barbara; Richard M. Wallach, Guerneville; Bonnie A. Baumgratz, Goleta; Michael E. Boyd, Isla Vista, all of Calif.

[73] Assignee: Santa Barbara Research Center, Goleta, Calif.

[21] Appl. No.: 474,700

[22] Filed: Feb. 2, 1990

Related U.S. Application Data

[63] Continuation of Ser. No. 153,387, Feb. 8, 1988, abandoned.

[51] Int. Cl.$^5$ .............................................. A01L 27/14
[52] U.S. Cl. ........................................ 357/30; 357/52; 357/32; 437/235; 437/904; 437/173; 437/170; 204/38.3; 204/42
[58] Field of Search .................. 437/904, 225, 228, 235, 437/236, 237, 238, 239, 16, 170, 173; 204/42, 15, 38.3; 357/30 B, 30 P, 52, 52 C, 32

[56] References Cited

U.S. PATENT DOCUMENTS

| | | | |
|---|---|---|---|
| 3,217,379 | 11/1965 | Mesecke | 357/30 B X |
| 3,554,818 | 1/1971 | Lambert et al. | 357/30 B X |
| 3,882,000 | 5/1975 | Schwartz et al. | 204/38 A |
| 3,977,018 | 8/1976 | Catagnus et al. | 204/56.1 X |
| 3,982,265 | 9/1976 | Johnston, Jr. | 357/30 |
| 4,119,993 | 10/1978 | Hartnagel et al. | 357/23 |
| 4,157,610 | 6/1979 | Kamei et al. | 437/16 X |
| 4,297,176 | 10/1981 | Hannah et al. | 437/236 X |
| 4,502,204 | 3/1985 | Togashi et al. | 29/571 |
| 4,507,181 | 3/1985 | Nath et al. | 204/15 |
| 4,569,728 | 2/1986 | Davari et al. | 204/15 |

OTHER PUBLICATIONS

Nemirovsky et al., "Anodic Oxide Films on $HG_{1-x}Cd_xTe$," *J. Electrochem. Soc.: Electrochemical Science and Technology*, May 1979, pp. 768-770.

Decker, "Growth and Dissolution of Thin Anodic Layers on GaAs: Photoelectrochemical Study," *Electrochimica Acta*, vol. 30, No. 3, 1985, pp. 301-304.

Qian et al., "Effects of Surface Adsorption of Ruthenium (3x) and Other Cations on Photoelectrochemical Properties of N-Indium Phosphide," 72-72 (Electrochemistry), Chemical Abstract No. 106:10491G, 1986.

*Primary Examiner*—William Mintel
*Attorney, Agent, or Firm*—W. C. Schubert; W. K. Denson-Low

[57] ABSTRACT

A method is disclosed for passivating infrared detector arrays 50. A wafer 48 of indium antimonide (InSb) is subjected an anodization process while being illuminated by a bright incandescent lamp 66. In one embodiment, the photo-anodized layer 72 is used in an array 50 to passivate implanted diode regions 76, 78 on the front side thereof, while employing an antireflective coating 74 on the backside anodized surface 70.

12 Claims, 3 Drawing Sheets

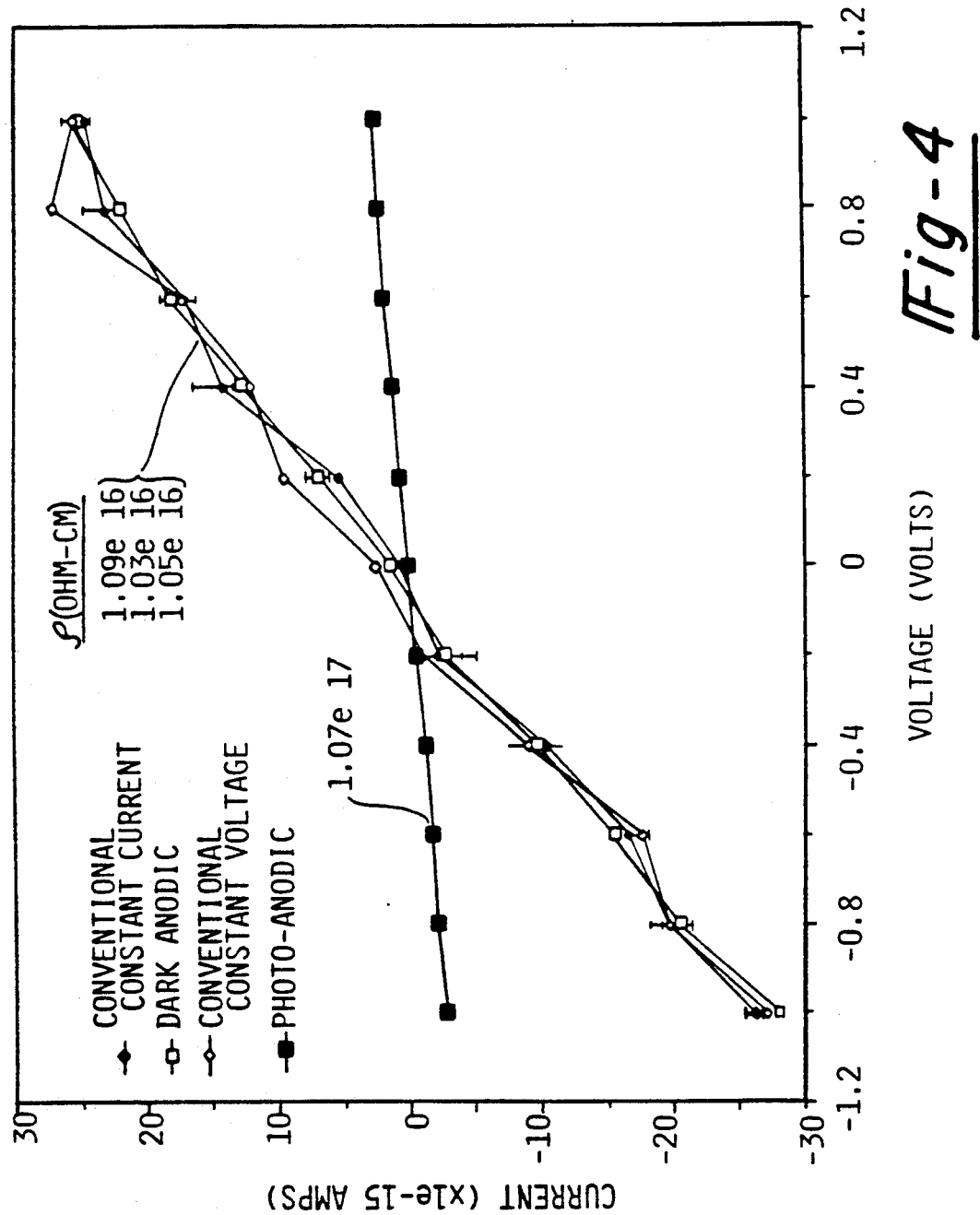

PHOTO-ANODIC OXIDE SURFACE PASSIVATION FOR SEMICONDUCTORS

This is a continuation of application Ser. No. 07/153,387 filed Feb. 8, 1988, now abandoned.

BACKGROUND OF THE INVENTION

1. Technical Field

This invention relates to semiconductor passivation techniques and, more particularly, to passivation of semiconductors used for infrared detector arrays.

2. Background

Dielectric layers of oxides and nitrides have commonly been used for semiconductor surface passivation. One particular class of devices where passivation is required is infrared detector arrays employing a plurality of p-n junctions or diodes whose electrical characteristics vary as a function of incident radiation flux. Infrared detectors capable of being used in surveillance and target seeking purposes as well as search and tracking imaging systems need to sense the presence of electromagnetic radiation having wavelengths in the range of about 1-30 microns. While several materials can be used to sense infrared radiation at these wavelengths, indium antimonide has been found to be quite promising for the 3-5 micron band. Unfortunately, the known techniques for indium antimonide (InSb) surface passivation have not been entirely satisfactory. Various oxides or nitrides including the conventional anodic oxides ($In_2O_3+Sb_2O_3$), $SiO$, $SiO_x$, $SiO_2$, $SiO_xN_y$, $Si_3N_4$, etc. have been used for InSb surface passivation. However, due to either a deviation from the zero flatband voltage or poor insulating properties, they generally could not be used by themselves for passivating a InSb diode surface. In order to achieve good detector performance, gated structures are normally required for the above oxides or nitrides for passivation. The use of these gated structures, however, have their drawbacks. One major problem is their gate bias instability. In addition, extreme care must be taken during processing and testing of these structures. Also, for FPA (focal plane array) manufacturing, very cumbersome assembling and testing procedures are usually required.

SUMMARY OF THE INVENTION

The present invention provides a method for passivating InSb semiconductor surfaces so that diode arrays can be fabricated, that have good performance characteristics without requiring the addition of conventional gated structures.

According to the method of this invention an insulating layer is formed on a semiconductor by illuminating it with a bright incandescent light while the substrate has a positive electrical potential applied to it and it is in an oxidizing medium. This process, which may be termed a "photo-anodic" oxide passivation technique, has provided the resultant devices with extremely good characteristics as will be discussed later herein.

BRIEF DESCRIPTION OF THE DRAWINGS

FIG. 4 is a graph comparing resistivity of photo-anodic oxides made in accordance with the present invention with those of anodic oxides formed by other techniques.

DESCRIPTION OF THE PREFERRED EMBODIMENT

Figure 1:
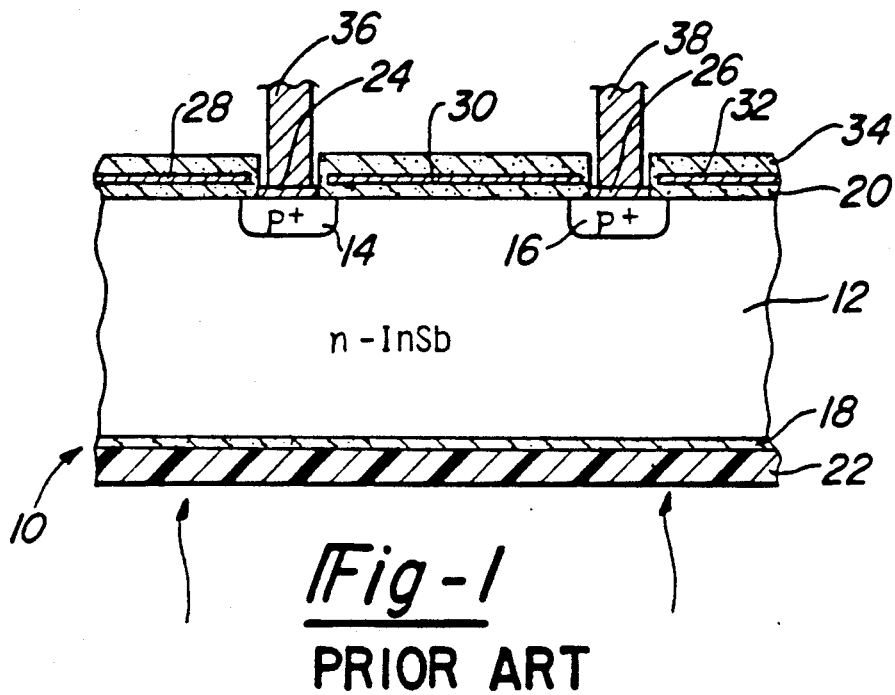
FIG. 1 illustrates a conventional gated InSb diode array of the PRIOR ART.

The device shown in FIG. 1 illustrates a conventional gated detector array 10 employing an n-type indium antimonide (InSb) substrate 12 and two p+ type islands 14 and 16 therein forming a pair of diodes. Although only two diodes are shown it should be understood that a typical array contains many more such diodes. Conventionally grown oxide layer 18 is formed on the surface of substrate 12 by well known anodization techniques. An antireflective layer 22 is applied over the oxide layer 18. $SiO_2$ passivation layer 20 is deposited on the diode surface and windows are formed in this layer 20 to make room for metallic contacts 24 and 26 onto regions 14 and 16, respectively. Indium bumps 36 and 38 are deposited on metal contacts 24 and 26 in order to access electrical signal to readout or carrier circuits by mating with corresponding indium bumps on these circuits. As is known in the art, the characteristics of each p-n junction is a function of incident radiation which falls onto the detector in the particular area where the junction is located. For example, an appropriate electrical field can be applied across each p-n junction, with the current therethrough changing as a function of the amount of infrared radiation incident the particular p-n junction.

Unfortunately, the oxide passivation layer 20 of the prior art device exhibits nonzero surface potential which generally necessitates the use of additional gating structures to achieve zero surface potential. These gate structures are provided by the metallic layers 28, 30 and 32 overlaying the area of the substrate 12 between the regions 14 and 16, although in practice the layers are actually needed only over the p-n junction region. The gates are covered with an oxide layer generally designated by the numeral 34 such as $SiO_2$. Negative potential (bias) is usually applied on the gates to compensate for nonzero (negative) surface potential of n-type InSb.

As noted above, the use of the gated structures of the prior art required additional processing steps which can increase manufacturing costs and result in potentially lower yields. In addition, the outputs of detector arrays made by this technique are subject to deleterious changes due to optimum gate bias drift which is caused by moisture and its subsequent diffusion process in the oxide layer.

Figure 2:
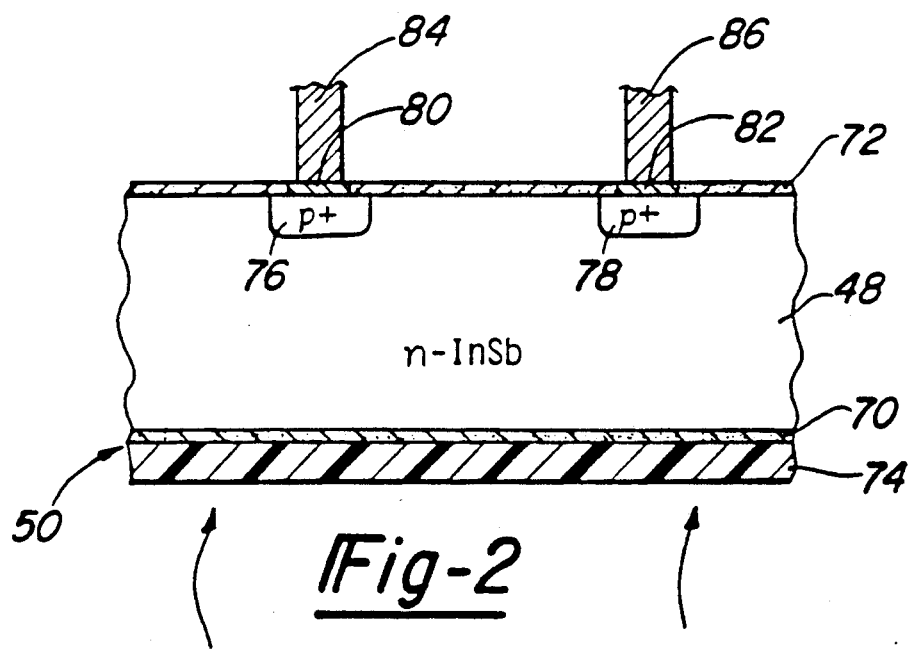
FIG. 2 is a cross-section of a semiconductor device made in accordance with the teachings of the present invention.
Figure 3:
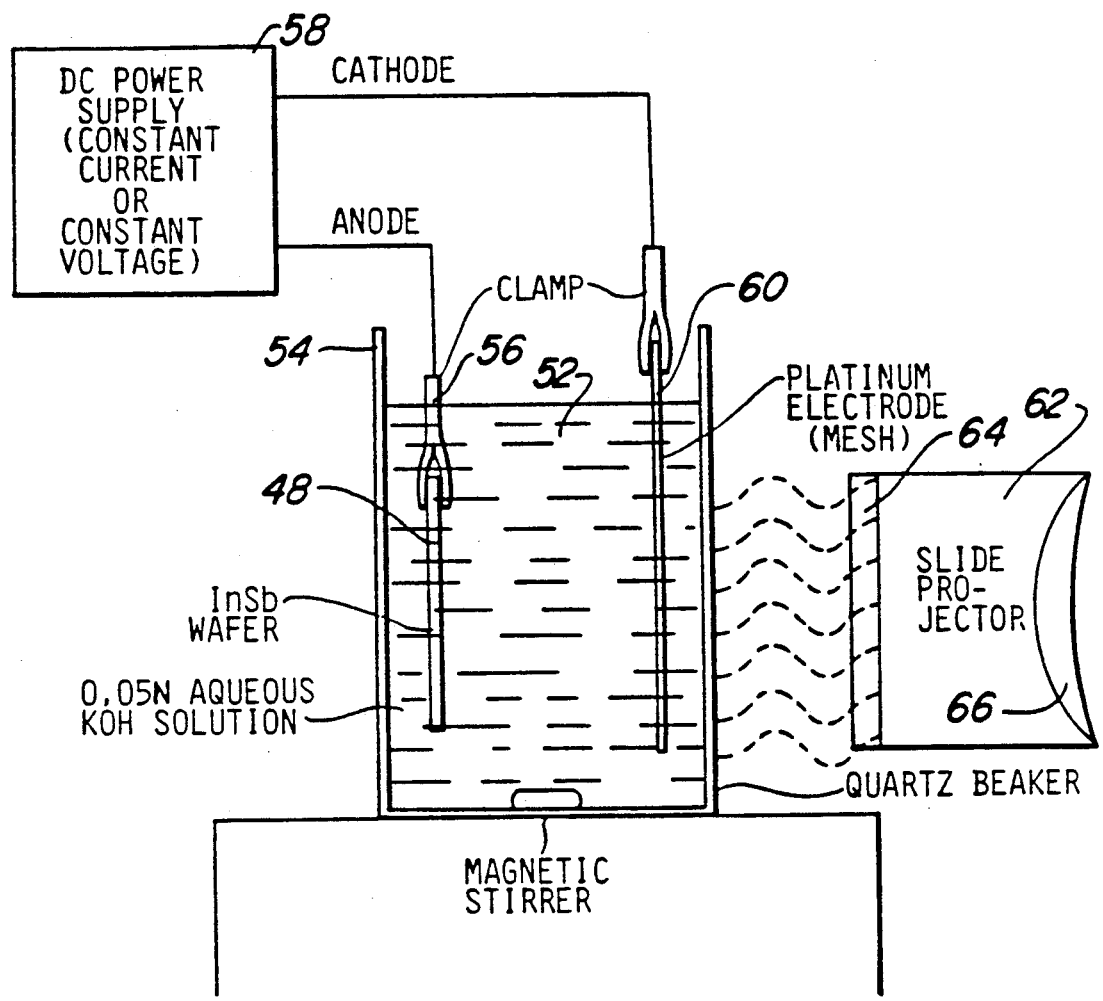
FIG. 3 is a view illustrating the apparatus used in performing the method of the preferred embodiment of this invention.

The method according to the present invention will now be described. Turning now to FIGS. 2 and 3, the invention broadly teaches the formation of one or more anodized layers on a semiconductor substrate or wafer surface while the wafer is being subjected to a bright incandescent lamp. In the preferred embodiment, the wafer is made of indium antimonide and it serves as an n-type substrate 48 of the array 50 shown in FIG. 2. While the preferred substrate is indium antimonide, it is believed that other suitable semiconductor materials can be used such as mercury-cadmium-telluride (HgCdTe), gallium-arsenide (GaAs), indium-phosphide (InP) or the like. In the specific example illustrated, the wafer 48 is immersed in an aqueous base solution 52 such as a 0.05N solution of KOH. However, the present invention can be used in connection with other oxidizing mediums, including nonaqueous as well as aqueous solutions, such as tetra-hydro-furfuryl alcohol/KOH.

The wafer 48 and solution 52 are contained in a transparent container 54 such as a quartz beaker. The wafer 48 is connected to a positive electrical potential by way of a platinum clamp 56 connected to an anode of a DC power supply 58. The cathode of supply 58 is connected to a suitable electrode 60 which is also immersed in the solution 52. In this embodiment, the electrode 60 is a mesh sheet of platinum.

According to an important aspect of this invention, the wafer 48 is illuminated by a bright light during the anodization process. In this embodiment, the light is provided by a 300 watt incandescent bulb 66 used in a Kodak model 760H slide projector 62. Preferably, the strength of the light that ultimately strikes the wafer 48 should be about 10 lumens per square inch and contain photon energy having a strength of 1.5 to 3.1 ev in the 4,000 to 8,000 Å wavelength region. The use of light with a lesser intensity is disadvantageous because flatband voltages move to the positive direction. The use of light with a higher intensity is disadvantageous because flatband voltages move to the negative direction. The use of photon energy with wavelengths below about 4,000 Å is disadvantageous because ultraviolet light degrades photo-anodic oxide/InSb interface characteristics. The use of light with wavelengths above 8,000 Å is disadvantageous because infrared heating effects may disturb the stable oxide growth rate.

By way of a specific example, the projector 62 was provided with an infrared filter 64 which attached to the projector lens. The filter 64 is designed to remove infrared radiation from the bulb 66 beyond the 8,000 Å wavelength. The distance between the projector lens and the wafer 48 is typically about six inches. The DC power supply 58 can be either a constant voltage or constant current source. In the case of a constant voltage source, a typical voltage is about 22 volts. The charge density is about $7.7 \times 10^{-4}$ coulomb/mm$^2$. Under these conditions it takes about 18-25 seconds to obtain a 550Å thick anodic oxide on wafer 48. in the case of a constant current source, a typical current density is 9-14 mA/cm$^2$ and a typical final voltage across the sample and the electrode 60 is 37-40 volts. It normally takes approximately four seconds to obtain a 750 Å thick anodic oxide. With the set-up shown in FIG. 3, the wavelength of the light that actually illuminates wafer 48 is in the visible spectrum (i.e., having a wavelength of 4,000 Å to 8,000 Å) because the projector lens cuts most of the ultraviolet spectra while the infrared filter 64 cuts most of the near infrared radiation. Throughout the remainder of this specification, the term "photo-anodized" layer will mean a layer formed in accordance with the above processing steps.

In order to make the detector array 50 shown in FIG. 2, the regions 76, 78 providing p-n junctions are formed by ion implantation and then the photo-anodized layer 72 is formed on the surface of substrate 48. Preferably, layer 72 is approximately 750 Å thick. This layer can be formed by the photo-anodization steps along the lines described above. The next steps in fabricating the array 50 include the application of the metal contacts 80, 82, so as to make electrical connection to the p-type regions 76, 78 and the formation of indium bumps 84 and 86. The back surface on which infrared radiation will be incident is first anodized (layer 70) and then deposited with an antireflection layer 74. These steps can be performed in any convenient order. The antireflective coating is generally a dielectric layer whose function is to reduce reflection of incident infrared radiation at the surface of a semiconductor.

As is known in the art, the electrical characteristics of the p-n junctions or diodes will vary depending upon the degree of infrared radiation that strike them. Various readout devices including charged-coupled devices (CCD's) may be appropriately connected to the array via indium bumps 84, 86 to read out these characteristics.

The photo-anodic layers also exhibit excellent insulation properties, especially at extreme temperatures such as typically encountered by indium antimonide detector arrays which normally operate optimally at 77 degrees K. or lower. This characteristic is illustrated in FIG. 4 in comparison with other anodic oxide layers formed by different processes. It can be seen that the present invention provides excellent characteristics that can be used to produce extremely stable, and high-performance infrared detectors without requiring conventional gating structures. Accordingly, the resultant product should be comparatively simpler to produce thereby providing a higher yield and therefor lower overall cost.

It should be understood that while this invention has been discussed in connection with one particular example that those skilled in the art will appreciate that other modifications can be made without departing from the spirit of this invention after studying the specification, drawings and following claims.

What is claimed is:

1. A method of forming an indium-antimonide (InSb) infrared detector for the 3-5 micron range having substantially zero flatband voltage characteristics without requiring gated structures, said method comprising:
    placing an indium-antimonide substrate in a container filled with an aqueous solution;
    applying a positive electrical potential to the substrate; and
    illuminating the substrate with light having a wavelength of 4000-8000 Å and a preselected intensity for a sufficient period of time to grow an anodization layer thereon of desired thickness;
    forming a plurality of p-n junctions in the substrate so that said anodization layer covers and passivates the junctions;
    said anodization layer providing such improved passivation characteristics that gated structures are not required.

2. The method of claim 1 wherein the solution is a base.

3. The method of claim 1 wherein the solution is potassium hydroxide.

4. The method of claim 1 wherein the container is made of quartz whereby the container wall does not contaminate the aqueous base solution and thereby the substrate surface.

5. The method of claim 1 wherein an opposite surface of the substrate is provided with an antireflective layer.

6. The method of claim 1 wherein said light which illuminates the substrate has an intensity of about 10 lumens per square inch.

7. The method of claim 1 wherein the light illuminating said substrate contains photon energy having a strength of 1.5-3.1 electron volts.

8. The method of claim 1 wherein said light that illuminates the substrate is generated by the steps of:
a) energizing a bright incandescent lamp;
b) using a lens to filter ultraviolet radiation from the lamp; and
c) using an infrared filter to filter near infrared radiation from the lamp.

9. An indium-antimonide infrared detector for the 3-5 micron range having substantially zero flatband voltage characteristics without requiring gated structures, said detector being fabricated according to the steps of:
placing an indium-antimonide substrate in a container filled with an aqueous solution;
applying a positive electrical potential to the substrate; and
illuminating the substrate with light having a wavelength of 4000-8000 Å and a preselected intensity for a sufficient period of time to grow an anodization layer thereon of desired thickness;
forming a plurality of p-n junctions in the substrate so that said anodization layer covers and passivates the junctions;
said anodization layer providing such improved passivation characteristics that gated structures are not required.

10. The detector of claim 9 wherein said light which illuminates the substrate has an intensity of about 10 lumens per square inch.

11. The detector of claim 9 wherein the light illuminating said substrate contains photon energy having a strength of 1.5-3.1 electron volts.

12. The detector of claim 9 wherein said light that illuminates the substrate is generated by the steps of:
a) energizing a bright incandescent lamp;
b) using a lens to filter ultraviolet radiation from the lamp; and
c) using an infrared filter to filter near infrared radiation from the lamp.

* * * * *